United States Patent
Ko et al.

(10) Patent No.: US 11,724,944 B2
(45) Date of Patent: Aug. 15, 2023

(54) COMPOUND SEMICONDUCTOR AND USE THEREOF

(71) Applicant: LG CHEM, LTD., Seoul (KR)

(72) Inventors: Kyung Moon Ko, Daejeon (KR); Cheol Hee Park, Daejeon (KR); Min Kyoung Kim, Daejeon (KR); Chee Sung Park, Daejeon (KR); Myung Jin Jung, Daejeon (KR); Yu Ho Min, Daejeon (KR)

(73) Assignee: LG CHEM, LTD., Seoul (KR)

( * ) Notice: Subject to any disclaimer, the term of this patent is extended or adjusted under 35 U.S.C. 154(b) by 1059 days.

(21) Appl. No.: 16/476,500

(22) PCT Filed: Dec. 20, 2017

(86) PCT No.: PCT/KR2017/015117
§ 371 (c)(1),
(2) Date: Jul. 8, 2019

(87) PCT Pub. No.: WO2018/169172
PCT Pub. Date: Sep. 20, 2018

(65) Prior Publication Data
US 2022/0274845 A1     Sep. 1, 2022

(30) Foreign Application Priority Data

Mar. 15, 2017  (KR) .................. 10-2017-0032641

(51) Int. Cl.
*C01G 51/00*  (2006.01)
*H01L 31/032*  (2006.01)
*H10N 10/852*  (2023.01)

(52) U.S. Cl.
CPC .......... *C01G 51/006* (2013.01); *H01L 31/032* (2013.01); *H10N 10/852* (2023.02)

(58) Field of Classification Search
CPC ..... C01G 51/006; C01G 51/00; H01L 31/032; H01L 35/16; H01L 31/0272; H01L 35/12;
(Continued)

(56) References Cited

U.S. PATENT DOCUMENTS 6,369,314  B1    4/2002  Nolas
2003/0056819  A1    3/2003  Imai et al.
(Continued)

FOREIGN PATENT DOCUMENTS

CN    101350394 A    1/2009
EP    3203535 A1    8/2017
(Continued)

OTHER PUBLICATIONS

Jae-Ki Lee "Thermoelectric Properties of the Co-doped n-type CoSb3 Compound" Journal of the Korean Physical Society, vol. 57, No. 4, Oct. 2010, pp. 1010-1014 (Year: 2010).*
(Continued)

*Primary Examiner* — Michael Y Sun
(74) *Attorney, Agent, or Firm* — Birch, Stewart, Kolasch & Birch, LLP

(57) ABSTRACT

A compound semiconductor which has an improved thermoelectric performance index together with excellent electrical conductivity, and thus may be utilized for various purposes such as a thermoelectric conversion material of thermoelectric conversion devices, solar cells, and the like, and to a method for preparing the same.

12 Claims, 4 Drawing Sheets

(58) Field of Classification Search
CPC ......... H01L 35/18; H01L 35/34; Y02E 10/50; C01B 19/002
See application file for complete search history.

(56) References Cited

U.S. PATENT DOCUMENTS

| | | |
|---|---|---|
| 2004/0186000 A1 | 9/2004 | Kawamoto et al. |
| 2006/0016470 A1 | 1/2006 | Yang et al. |
| 2010/0139730 A1 | 6/2010 | Bentien et al. |
| 2011/0240081 A1 | 10/2011 | Rhyee et al. |
| 2011/0240083 A1 | 10/2011 | Rhyee et al. |
| 2013/0009116 A1 | 1/2013 | Park et al. |
| 2014/0174494 A1 | 6/2014 | Cho et al. |
| 2016/0204327 A1 | 7/2016 | Kwon et al. |
| 2016/0343930 A1 | 11/2016 | Rhyee et al. |
| 2017/0217783 A1* | 8/2017 | Lee .................... H01L 35/34 |

FOREIGN PATENT DOCUMENTS

| | | |
|---|---|---|
| JP | 2000-188426 A | 7/2000 |
| JP | 2006-303427 A | 11/2006 |
| KR | 10-2009-0026667 A | 3/2009 |
| KR | 10-2011-0109564 A | 10/2011 |
| KR | 10-2012-0070124 A | 6/2012 |
| KR | 10-2014-0065721 A | 5/2014 |
| KR | 10-2016-0137847 A | 12/2016 |
| WO | WO 2012/157904 A1 | 11/2012 |
| WO | WO 2015/050420 A1 | 4/2015 |
| WO | WO 2016/052948 A1 | 4/2016 |
| WO | WO-2016052948 A1 * | 4/2016 .......... C01F 17/0012 |
| WO | WO 2017/013348 A | 1/2017 |

OTHER PUBLICATIONS

Bo Duan Enhanced thermoelectric performance in sulfur-doped Co4Sb11.9—xTexS0.1 skutterudites Materials Letters 79 (2012) 69-71 (Year: 2012).*
Duan et al., "Electronegative guests in $CoSb_3$", Energy Environmental Science, 2016, 9, pp. 2090-2098.
Duan et al., "Enhanced thermoelectric performance in sulfur-doped $Co4Sb_{11.9-x}Te_xS_{0.1}$ skutterudites", Materials Letters 79 (2012), pp. 69-71.
International Search Report for PCT/KR2017/015117 (PCT/ISA/210) dated Mar. 29, 2018.
Sun et al., "Effect of HPHT processing on the structure, and thermoelectric properties of $Co_4Sb_{12}$ co-doped with Te and Sn", Journal of Materials Chemistry A, 2015, 3, 4637-4641, total of 2 pages.
Chmielowski et al., "High thermoelectric performance of tellurium doped paracostibite," Journals of Materials Chemistry C, vol. 4, 2016, pp. 3094-3100 (8 pages total).
Extended European Search Report for European Application No. 17901260.4, dated Jan. 22, 2020.
Nolas et al., "Thermoelectric properties of Sn-filled skutterudites," Applied Physics Letters, vol. 77, No. 1, Jul. 3, 2000, pp. 52-54.
Karthikeyan et al.. "Thermoelectric Properties of Se and Zn/Cd//Sn Double Substituted Co4Sb12 Skutterudite Compounds", Physical Chemistry Chemical Physics, vol. 19, No. 41, 2017, pp. 1-28 (29 pages total).
Liu el al., "Improvement of Thermoelectric Performance of CoSb3-xTex Skutterudite Compounds by Additional Substitution of IVB-Group Elements for Sb", Chem Mater., vol. 20, No. 24, 2008, pp. 7256-7531.
Author Unknown, "Ways to optimaize the performances of the CoSb3 thermoelectric materials." Engineering Science and Technology, Chinese Doctoral Dissertations Full-text Database, No. 8, 2016, pp. 17, 41-53 (19 pages total), with an English translation.

* cited by examiner

[FIG. 1]
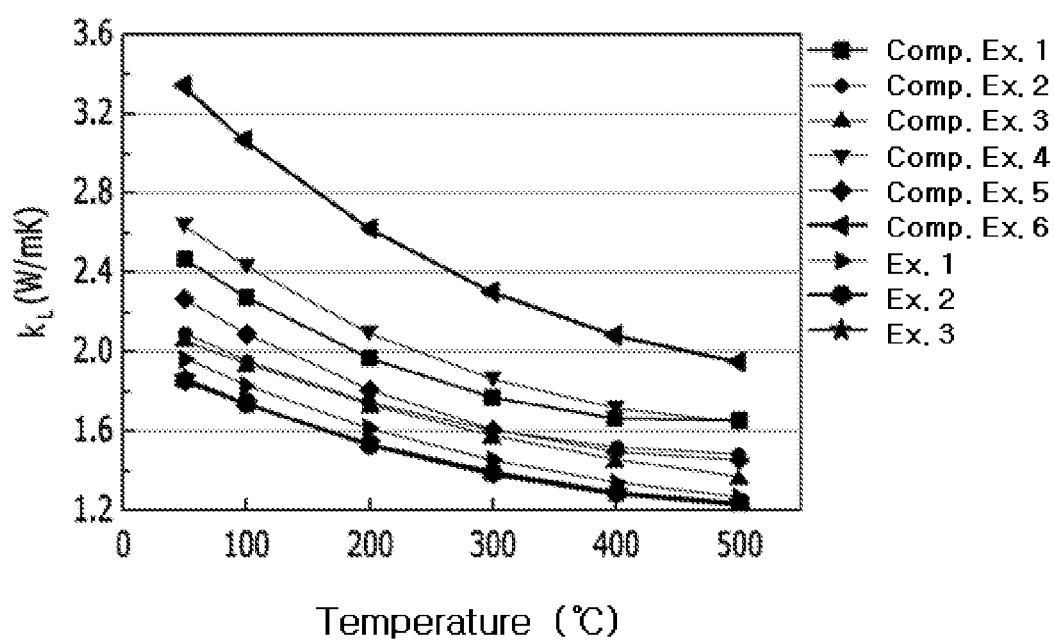

[FIG. 2]
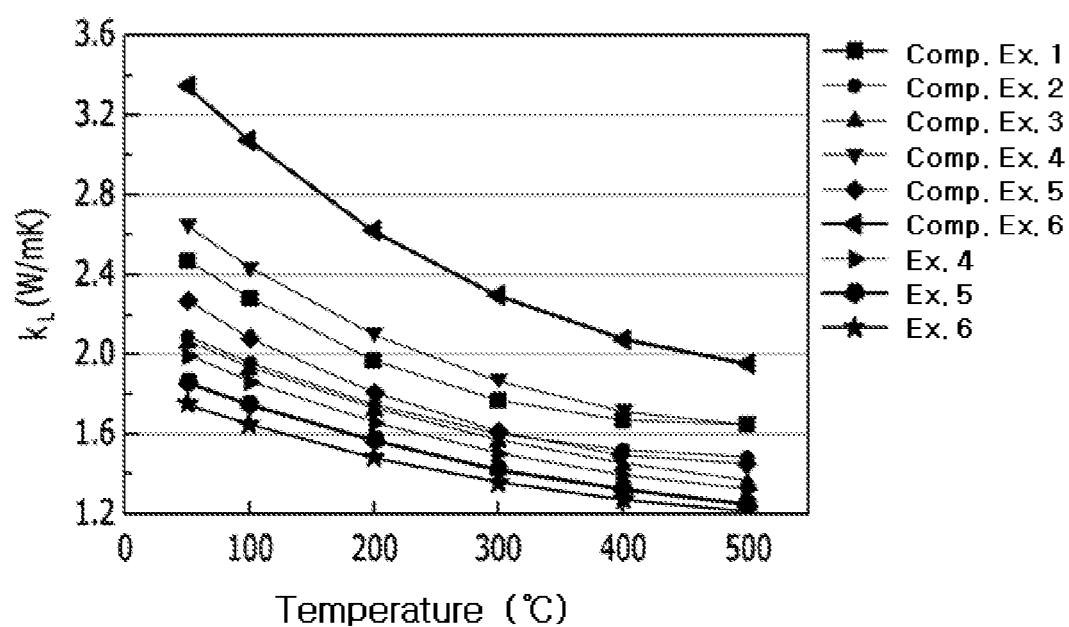

[FIG. 3]
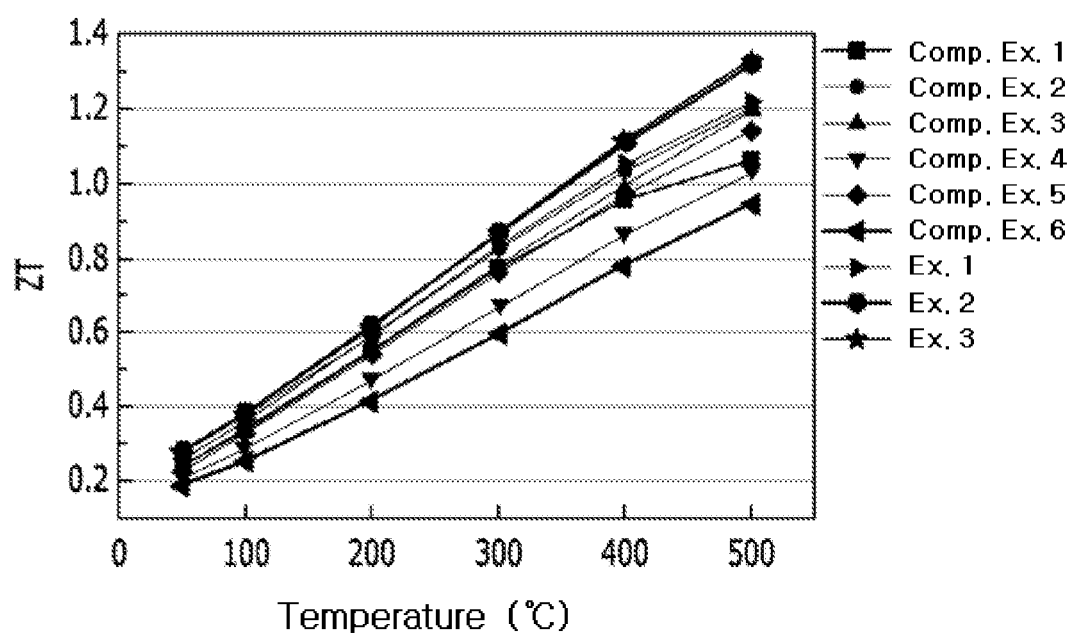

[FIG. 4]
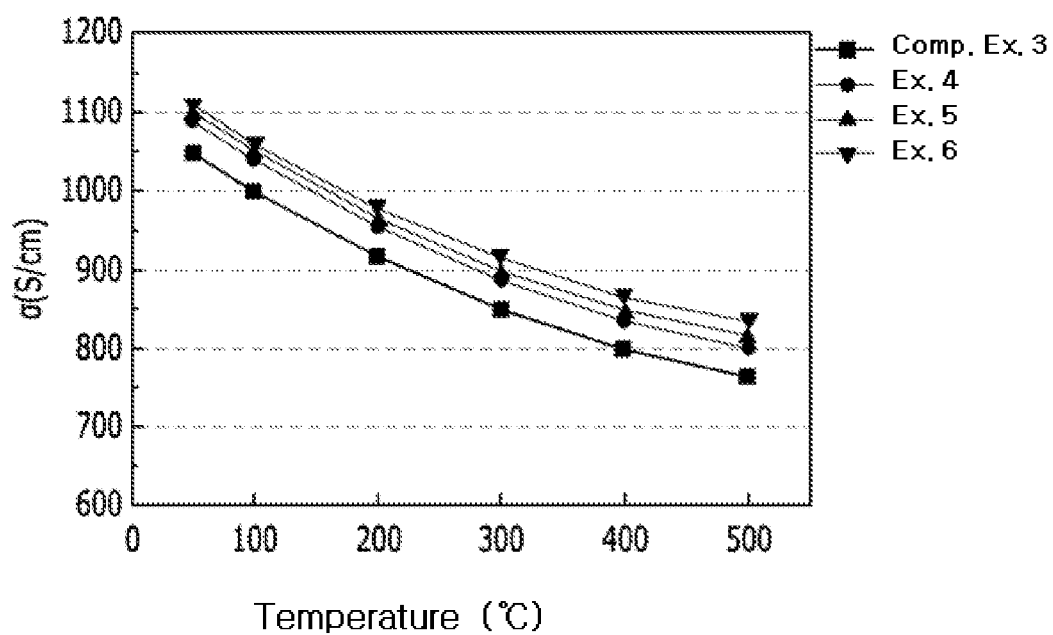

COMPOUND SEMICONDUCTOR AND USE THEREOF

CROSS-REFERENCE TO RELATED APPLICATION(S)

This application claims the benefit of priority from Korean Patent Application 10-2017-0032641 filed on Mar. 15, 2017 with the Korean Intellectual Property Office, the disclosure of which is incorporated herein by reference in its entirety.

TECHNICAL FIELD

The present invention relates to a novel compound semiconductor which has an improved thermoelectric performance index together with excellent electrical conductivity, and thus can be utilized for various purposes such as a thermoelectric conversion material of thermoelectric conversion devices, solar cells, and the like, and to a method for preparing the same and the use thereof.

BACKGROUND ART

A compound semiconductor is not made of a single element such as silicon or germanium but is made of a compound composed of two or more types of elements, and operates as a semiconductor. Various types of these compound semiconductors have been developed and are currently used in various fields of industry. Typically, a compound semiconductor may be used for thermoelectric conversion devices using the Peltier effect, light emitting devices such as light emitting diodes or laser diodes using a photoelectric conversion effect, solar cells, or the like.

Among these, the thermoelectric conversion devices may be applied to thermoelectric conversion power generation, thermoelectric conversion cooling, or the like. Here, in thermoelectric conversion power generation, a thermal electromotive force generated as a result of a temperature difference in the thermoelectric conversion devices is used for converting thermal energy to electrical energy. The energy conversion efficiency of the thermoelectric conversion device depends on ZT, which is a performance index value of thermoelectric materials. Here, ZT is determined based on a Seebeck coefficient, electrical conductivity, thermal conductivity, or the like. More specifically, ZT is proportional to the square of the Seebeck coefficient and the electrical conductivity, and is inversely proportional to the thermal conductivity. Therefore, in order to enhance the energy conversion efficiency of a thermoelectric conversion device, development of a thermoelectric material having a high Seebeck coefficient, high electrical conductivity, or low thermal conductivity is required.

A binary skutterudite structure having a unit lattice belonging to the cubic crystallographic space group Im3 is known as a material satisfying the requirements for having a high ZT value. The skutterudite structure has a lattice structure which not only contains 32 atoms arranged in 8 TX3 groups in a unit lattice, but also has a relative large unit lattice and thus can improve thermoelectric properties due to a decrease in the lattice thermal conductivity. At this time, T is a transition element which is occupied by elements such as Co, Rh, Ir, or the like, and X is a nicogen element which is occupied by P, As, Sb, or the like.

However, the binary skutterudite exhibits low efficiency in thermoelectric properties due to its relatively high lattice thermal conductivity. To improve this, a method of reducing the lattice thermal conductivity by filling rattler atoms as a filler at two voids present in a skutterudite unit lattice to cause a rattling effect, or a method of improving a thermoelectric performance index by replacing part of elements with doping elements to cause band engineering, mass fluctuation, or the like, and deriving the concentration adjustment of hole carriers and the lattice scattering, or the like, are being studied.

Various fillers having an effect of lowering the thermal conductivity of materials have been proposed, but rattler atoms exhibiting excellent thermoelectric properties are very expensive and vulnerable to oxidation and thus process cost is increased. Further, thermoelectric materials using them show an unstable posture at a high temperature and thus may deteriorate the durability of a thermoelectric module for power generation.

Therefore, there is a need to develop a skutterudite which can maintain a high ZT value while being stable at a high temperature, by adding a new rattler atom capable of lowering the content of rattler atoms to reduce costs and also compensating it.

DETAILED DESCRIPTION OF THE INVENTION

Technical Problem

It is an object of the present invention to provide a novel compound semiconductor which has an improved thermoelectric performance index together with excellent electrical conductivity, and thus can be utilized for various purposes such as a thermoelectric conversion material of thermoelectric conversion devices, a light absorbing layer material of solar cells, and the like, and a method for preparing the same and the use thereof.

It is an object of the present invention to provide a thermoelectric conversion device including the above-mentioned compound semiconductor.

Technical Solution

After repeated studies on compound semiconductors in order to achieve the objects above, the present inventors successfully synthesized a compound semiconductor represented by Chemical Formula 1 below, and found that this compound can be used for a thermoelectric conversion material of thermoelectric conversion devices, a light-absorbing layer of solar cells, or the like, thereby completing the present invention.

Hereinafter, preferred embodiments of the present invention will be described in detail. Prior to the description, it will be understood that words or terms used in the specification and the appended claims shall not limited to meanings defined in commonly used dictionaries. It will be further understood that the words or terms should be interpreted as having a meaning that is consistent with their meaning in the context of the relevant art and the technical idea of the invention, based on the principle that an inventor may properly define the meaning of the words or terms to best explain the invention.

Therefore, the constitution illustrated herein is merely a preferable embodiment and does not represent all the technical ideas of the present invention, thus it should be understood that other equivalents and modifications at the time of the present application could be made thereto without departing from the spirit and scope of the disclosure.

According to one embodiment of the present invention, a novel compound semiconductor represented by the following Chemical Formula 1 is provided:

$$S_xCo_4Sb_{12-y-z}Q_ySn_z \quad \text{[Chemical Formula 1]}$$

wherein, in Chemical Formula 1,

Q includes at least one among O, Se, and Te, and x, y, and z denote a molar ratio of each element, wherein $0<x\leq1$, $0<y<12$, $0<z<12$, $0<y+z<12$, and $y\geq3x$.

In Chemical Formula 1, S is the element symbol denoting sulfur, Co is the element symbol denoting cobalt, Sb is the element symbol denoting antimony, Sn is the element symbol denoting tin, and Q is used to replace at least one chalcogen element selected from the group consisting of oxygen, selenium, and tellurium.

In addition, in Chemical Formula 1, x denotes a relative molar ratio of sulfur (S), y denotes a relative molar ratio of at least one element (Q) selected from the group consisting of oxygen (O), selenium (Se), and tellurium (Te), and z denotes a relative molar ratio of tin (Sn).

As described above, the compound semiconductor of Chemical Formula 1 according to one embodiment of the present invention is one in which S is filled as a filler in an n-type Co—Sb skutterudite which is simultaneously substituted with a chalcogen element Q and Sn at Sb (antimony) sites. As $Q^{2-}$ is substituted at $Sb^-$ sites in this manner, n-type carriers are increased and thereby electrical characteristics can be improved. Further, since S is filled in the void spaces present at a skutterudite unit lattice to cause a vibration or the like, phonon scattering occurs. As a result, the lattice thermal conductivity can be reduced and thereby the thermoelectric performance index can be improved. Further, Sn is substituted at $Sb^-$ sites to generate a difference in mass when forming a lattice, whereby phonon scattering may occur to further reduce the lattice thermal conductivity. As a result, it is possible to overcome the limit of conventional skutterudite-type thermoelectric materials employing rattler atoms which are difficult to handle and are very expensive, thereby maintaining a high ZT value while being stable at a high temperature.

Also, the effects resulting from the filling of S and the substitution with the chalcogen element Q and Sn may be further increased through optimization of the content in the compound semiconductors.

Specifically, in the compound semiconductor of Chemical Formula 1, S is a filling element showing high electronegativity, and plays a role of forming a polar covalent bond with Sb and generating a new vibration mode to lower the lattice thermal conductivity. Particularly, the effect of reducing the lattice thermal conductivity due to the S filling is remarkable compared with the case of conventional Sn filling. Further, since S has a high stability to oxidation at a high temperature, the durability in a thermoelectric module can improved while minimizing the process cost.

The S can included at a value of x, where $0<x\leq1$, which is a relative molar ratio to the constituent elements constituting the compound semiconductor of Chemical Formula 1. When x is more than 1, a secondary phase may be formed while S is not located at the empty spaces in the Co—Sb unit lattice. Thus, as the thermal conductivity of the compound semiconductor of Chemical Formula 1 abruptly increases, the thermoelectric performance may be deteriorated. In consideration of an excellent improvement effect due to the filling of S, S may be contained in a molar ratio of specifically $0.01\leq x<1$, more specifically $0.1\leq x\leq0.5$, and even more specifically $0.1\leq x\leq0.2$.

In addition, in the compound semiconductor of Chemical Formula 1, when Q is substituted and introduced at Sb sites, the carrier concentration can be increased, thereby further improving the electrical property of the compound semiconductor of Chemical Formula 1. Specifically, the Q may include a single element of O, Se, or Te, or two or more elements among them. In consideration of the excellent improvement effect, it can more specifically include a single element of Se or Te, and can more specifically include Te among them.

Such Q can be included at a value of y, specifically $0<y<12$, which is a relative molar ratio to the constituent elements constituting the compound semiconductor of Chemical Formula 1. When the molar ratio y of Q is more than 12, a skutterudite phase having void spaces may not be formed, and when y is 0, the improvement effect in the electrical characteristics of the compound semiconductors cannot be obtained. In consideration of the excellent improvement effect due to the content control of the Q element, Q may be more specifically contained in a content of $0<y\leq1$, and even more specifically $0.6\leq y\leq0.8$.

In addition, in the compound semiconductor of Chemical Formula 1, as Sn is substituted and introduced at Sb sites of S-filled skutterudite, the lattice thermal conductivity is reduced, and as a result, the thermoelectric performance index may be improved.

Such Sn can be included at a value of z, specifically $0<z<12$, which is a relative molar ratio to the constituent elements constituting the compound semiconductor of Chemical Formula 1. When z is more than 12, bounding in the lattice thermal conductivity may occur, and when z is 0, a reduction in the lattice thermal conductivity and an effect of improving the thermoelectric performance index resulting therefrom may not be obtained. In consideration of an excellent improvement effect due to the control of a substitution amount of Sn, Sn may be more specifically contained in an amount of $0<z\leq0.2$, and even more specifically $0.05\leq z\leq0.2$.

In addition, in the compound semiconductor of Chemical Formula 1, the content of Q may affect the filling amount of S and the amount of Sn. In order to obtain a sufficient reducing effect in the lattice thermal conductivity due to the filling of S together with the substitution with Sn, it is preferable that the filling amount of S is controlled together with the substitution amount of Q and Sn under the above content range conditions.

Specifically, for the filling of S, S includes a corresponding composition in the concept of doping, wherein the content x of S and the content y of Q element must satisfy the condition of $y\geq3x$. When $y<3x$, S cannot stably exist in voids and thus exhibits the tendency to exist in a stable phase through formation of a different composition. In this case, the formation of a secondary phase such as CoSSb leads to a result that the added S is not completely filled and also the reduction in the lattice thermal conductivity will be insufficient.

Further, in order to obtain a sufficient reduction effect in the lattice thermal conductivity due to the substitution with Sn, the substitution amount of Sn must be more than a predetermined level. The substitution with Sn can lead to a decrease of the lattice thermal conductivity as well as an increase of p-type carriers, thereby reducing electrical characteristics. Therefore, when the increase of p-type carriers due to the substitution with Sn becomes more than a certain level, the content of Q must be further increased to compensate this. Thereby, in the compound semiconductor of Chemical Formula 1, in order to obtain a sufficient reduction effect in the lattice thermal conductivity due to the filling of S and the substitution with Sn, specifically $y \geq 3x$ when $0 < y+z < 1$, and $y=3x+z$ when $1 \leq y+z < 12$, and more specifically $y > 3x$.

Meanwhile, the compound semiconductor represented by Chemical Formula 1 may include a part of the secondary phase, and the amount thereof may vary depending on the thermal treatment conditions.

The compound semiconductor of Chemical Formula 1 according to one embodiment of the present invention can be prepared by a method including (Step 1) a step of preparing a mixture by mixing S, Co, Sb, Q elements (including at least one element among O, Se, and Te), and Sn so as to satisfy the compound composition of Chemical Formula 1; and (Step 2) a step of thermally treating the mixture. Thereby, a method of preparing the compound semiconductor according to another embodiment of the present invention is provided.

Hereinafter, the present invention will be described in detail for each step. Step 1 for the preparation of the compound semiconductor according to one embodiment of the present invention is a step of mixing constituent components constituting a compound semiconductor.

The mixing can be performed according to a conventional method except that the respective constituent components are mixed under the condition of the above-described content ratio.

Further, the mixing of each constituent component can be carried out so as to satisfy the composition of the compound of Chemical Formula 1.

In general, when S is filled into the compound semiconductor, it is difficult to fill S alone. Particularly, when Sn is substituted, n-type carriers are decreased, and therefore the filling of S is more difficult. In contrast, the substitution with the Q element including Te enhances n-type carriers. Thereby, in the present invention, the substitution amount of the Q element is increased as much as the substitution amount of Sn to prevent the decrease of n-type carriers and to enable the filling of S. Specifically, when x, y, and z are the molar ratio of S, Q, and Sn, respectively, S, Q, and Sn can be used so as to satisfy the conditions of $0 < x \leq 1$, $0 < y < 12$, $0 < z < 12$, $0 < y+z < 12$, and $y \geq 3x$. In order to obtain a sufficient reduction effect in the lattice thermal conductivity due to the filling of S together with the substitution with Sn, it may be used in the content of $3x < y$, and more specifically in the content of $y \geq 3x$ when $0 < y+z < 1$, and $y=3x+z$ when $1 \leq y+z < 12$.

Further, each raw material mixed in the mixture forming step may be in a powder form, but the present invention is not limited to a specific form of the mixing material.

Next, Step 2 for the preparation of compound semiconductor according to one embodiment of the present invention is a step of thermally treating the mixture prepared in Step 1.

The thermal treatment may be performed under vacuum, or it may be performed while flowing an inert gas such as Ar, He, $N_2$, or the like, containing hydrogen or not containing hydrogen.

In this case, the temperature for thermal treatment may be 400° C. to 800° C. When the temperature for thermal treatment is lower than 400° C., the reaction of forming a compound semiconductor may not sufficiently occur, and when it is higher than 800° C., the characteristics of the compound semiconductor may be lowered due to the occurrence of side reactions. More specifically, the temperature for thermal treatment may be 450° C. to 700° C., and even more specifically 500° to 700° C.

Meanwhile, the thermal treatment step may be carried out in one stage, or may be carried out in multiple stages including two or more stages. For example, when carried out in two stages, the mixture prepared in a first thermal treatment step may be subjected to a first thermal treatment step in a first temperature range of 400° C. to 600° C., and then to a second thermal treatment stage in a second temperature range of 600° C. to 800° C.

Further, some thermal treatment steps among the plurality of thermal treatment steps may be performed in the mixture forming step of mixing raw materials. For example, when performing by three steps, the first thermal treatment step may be performed in a temperature range of 400° C. to 600° C., and the second and third thermal treatment steps may be performed in a temperature range of 600° C. to 800° C. At this time, the first thermal treatment step may be performed during the mixture forming step, and the second and third thermal treatment steps may be performed sequentially after the mixture forming step.

In addition, after the thermal treatment step, a step of cooling the thermally-treated mixture to prevent a secondary phase from forming may be optionally performed.

The cooling step is performed so as to lower the temperature of the thermally-treated mixture to ordinary temperature (about 20° C. to 30° C.), and various cooling methods or cooling devices known in the art may be used without limitation.

In addition, a pressure-sintering step may be optionally performed on the thermally-treated mixture or the cooled mixture after the thermal treatment, if necessary, for the filling of S and the activation of Q elements including Te.

Specific methods for proceeding with the pressure sintering step are not particularly limited, but it may be specifically performed by means of hot pressing or spark plasma sintering (SPS). More specifically, the pressure sintering step may be performed by using the spark plasma sintering (SPS) method. Spark plasma sintering (SPS) is a method for sintering a powder or plate by applying a pulsed direct current in a direction parallel to the pressing direction while pressing the powder or sheet in one axis, which is a sintering method in which pressure, low voltage, and high current are applied to a powder or plate and the high energy of the plasma generated instantaneously by the spark generated at this time is applied to electric field diffusion, thermal diffusion, or the like. Such spark plasma sintering is performed at a sintering temperature that is lower than that of conventional hot pressing, and sintering can be completed within a short period of time including the time for temperature rise and retention. Therefore, the power consumption is greatly reduced, handling is convenient, and running cost is low. In addition, it has advantages in that it does not require skills in sintering techniques and that it can be applied to materials that are difficult to sinter and process at a high temperature.

Further, the pressure sintering step may be specifically performed at a temperature of 500° C. to 700° C. under a pressure of 20 MPa to 50 MPa for 10 minutes to 60 minutes. If the sintering temperature is less than 500° C., or if the sintering time and pressure are low, a high-density sintered body cannot be obtained. Also, a high pressure is undesirable because it can lead to the risk to applied molds and equipment.

In addition, before performing the pressure sintering step, it may further include a step of pulverizing the thermally-treated mixture, or optionally a mixture cooled after the thermal treatment. Examples of the pulverizing method are not particularly limited, and various pulverizing methods or pulverizing apparatuses known in the art may be applied without limitation.

The compound semiconductors prepared according to the above-described preparation method have low lattice thermal conductivity and therefore exhibit an improved thermoelectric performance index and also have excellent electrical conductivity. Thereby, the above compound semiconductors can replace conventional compound semiconductors can be employed as another material in addition to conventional compound semiconductor materials. The above compound semiconductors may be utilized in various ways for a thermoelectric conversion material of thermoelectric conversion devices, a light absorbing layer material of solar cells, an IR window or IR sensor which selectively transmits infrared rays, magnetic devices, memories, or the like.

Thus, according to another embodiment of the present invention, a thermoelectric conversion device including the above-mentioned compound semiconductor as a thermoelectric conversion material is provided.

The thermoelectric conversion devices are the same as conventional thermoelectric conversion devices, except that the above compound semiconductors are used as the thermoelectric conversion material, and thus detailed description thereof will be omitted.

According to another embodiment of the present invention, a solar cell including the above-mentioned compound semiconductor is provided. At this time, the solar cell may include the compound semiconductor as a material forming the light absorbing layer of solar cells.

Specifically, the solar cell may be prepared with a structure in which a front transparent electrode, a buffer layer, a light-absorbing layer, a back electrode, and a substrate are laminated in order from the side where a solar rays are incident. The substrate located at the lowest part may be made of glass, and the back electrode formed thereon may be formed by depositing metal such as Mo or the like.

Subsequently, the compound semiconductor according to the present invention may be laminated on the upper part of the back electrode by means of an electron beam deposition method, a sol-gel method, a PLD (Pulsed Laser Deposition) method, or the like to thereby form the light-absorbing layer. On the upper part of the light-absorbing layer, a buffer layer for buffering the difference in a lattice constant and a band gap between a ZnO layer used as the front transparent electrode and the light-absorbing layer may be present. Such buffer layer may be formed by depositing a material such as CdS by a method such as CBD (Chemical Bath Deposition). Next, the front transparent electrode may be formed as a ZnO or ZnO and ITO laminated film on the buffer layer by a method such as sputtering.

The solar cell according to the present invention may be modified in various ways. For example, it is possible to manufacture a tandem solar cell, in which a solar cell using the compound semiconductor according to the present invention as a light-absorbing layer is laminated. In addition, other solar cells laminated as described above may employ a solar cell using silicon or another known compound semiconductor.

In addition, a plurality of solar cells which use compound semiconductors having different band gaps as light-absorbing layers may be laminated by changing the band gap of the compound semiconductor according to the present invention. The band gap of the compound semiconductor according to the present invention may be adjusted by changing a composition ratio of an element constituting the compound, particularly Te.

Further, the compound semiconductor according to the present invention may also be applied to IR windows or IR sensors which selectively pass IR.

ADVANTAGEOUS EFFECT

The compound semiconductors according to the present invention have low lattice thermal conductivity to show an improved thermoelectric performance index and also have excellent electrical conductivity. Thus, above compound semiconductors can replace conventional compound semiconductors or can be employed as another material in addition to conventional compound semiconductors, and thus may be utilized in various ways for a thermoelectric conversion material of thermoelectric conversion devices, a light absorbing layer material of solar cells, or the like.

BRIEF DESCRIPTION OF THE DRAWINGS

FIG. 1 is a graph showing evaluation results of the lattice thermal conductivity ($k_L$) of compound semiconductors of Examples 1 to 3 and Comparative Examples 1 to 6.

FIG. 2 is a graph showing evaluation results of the lattice thermal conductivity ($k_L$) of compound semiconductors of Examples 4 to 6 and Comparative Examples 1 to 6.

FIG. 3 is a graph showing evaluation results of the thermal performance index (ZT) of the thermoelectric device including compound semiconductors of Examples 1 to 3 and Comparative Examples 1 to 6.

FIG. 4 is a graph showing evaluation results of the electrical conductivity ($\sigma$) of compound semiconductors of Examples 4 to 6 and Comparative Example 3

DETAILED DESCRIPTION OF THE EMBODIMENTS

The present invention will be described in more detail by way of examples. However, these examples are given for illustrative purposes only, and the scope of the invention is not intended to be limited by these examples

EXAMPLE 1

In order to synthesize $S_{0.2}Co_4Sb_{11.35}Te_{0.6}Sn_{0.05}$, Sn, S, Co, Sb, and Te in a powder form were weighed, and then they were put into an alumina mortar and mixed. The mixed materials were put into an ultra hard mold and formed into a pellet, which was put into a fused silica tube and vacuum-sealed. Then, the resultant product was put into a box furnace and heated at 680° C. for 15 hours to give $S_{0.2}Co_4Sb_{11.35}Te_{0.6}Sn_{0.75}$. Thereafter, the resultant compound was slowly cooled down to room temperature, charged into a graphite mold for spark plasma sintering, and then subjected to spark plasma sintering at a temperature of 650° C. under a pressure of 50 MPa for 10 minutes. The relative density of the thus obtained compound semiconductor was measured to be 98% or more.

EXAMPLE 2

A compound semiconductor was prepared in the same manner as in Example 1, except that the mixture composition was changed to $S_{0.2}Co_4Sb_{11.325}Te_{0.6}Sn_{0.75}$.

EXAMPLE 3

A compound semiconductor was prepared in the same manner as in Example 1, except that the mixture composition was changed to $S_{0.2}Co_4Sb_{11.3}Te_{0.6}Sn_{0.1}$.

EXAMPLE 4

A compound semiconductor was prepared in the same manner as in Example 1, except that the mixture composition was changed to $S_{0.2}Co_4Sb_{11.3}Te_{0.65}Sn_{0.05}$.

EXAMPLE 5

A compound semiconductor was prepared in the same manner as in Example 1, except that the mixture composition was changed to $S_{0.2}Co_4Sb_{11.2}Te_{0.7}Sn_{0.1}$.

EXAMPLE 6

A compound semiconductor was prepared in the same manner as in Example 1, except that the mixture composition was changed to $S_{0.2}Co_4Sb_{11}Te_{0.8}Sn_{0.2}$.

Comparative Example 1

A compound semiconductor was prepared in the same manner as in Example 1, except that S, Co, Sb, and Te were prepared as reagents, and the mixture composition was changed to $S_{0.2}Co_4Sb_{11.6}Te_{0.4}$.

However, in the composition of the compound thus prepared, $S^{2-}$ was unstable due to an imbalance of charge balance and a part of S existed as a S-rich phase such as CoSSb. Thus, the filling of S was not completely achieved.

Comparative Example 2

A compound semiconductor was prepared in the same manner as in Example 1, except that S, Co, Sb, and Te were prepared as reagents, and the mixture composition was changed to $S_{0.2}Co_4Sb_{11.5}Te_{0.5}$. However, also in the composition of the compound thus prepared, the filling of S was not completely achieved due to an imbalance of charge balance.

Comparative Example 3

A compound semiconductor was prepared in the same manner as in Example 1, except that S, Co, Sb, and Te were prepared as reagents, and the mixture composition was changed to $S_{0.02}Co_4Sb_{11.4}Te_{0.6}$.

Comparative Example 4

A compound semiconductor was prepared in the same manner as in Example 1, except that S, Co, Sb, and Te were prepared as reagents, and the mixture composition was changed to $S_{0.05}Co_4Sb_{11.4}Te_{0.6}$.

Comparative Example 5

A compound semiconductor was prepared in the same manner as in Example 1, except that S, Co, Sb, and Te were prepared as reagents, and the mixture composition was changed to $S_{0.1}Co_4Sb_{11.4}Te_{0.6}$.

Comparative Example 6

A compound semiconductor was prepared in the same manner as in Example 1, except that S, Co, Sb, and Te were prepared as reagents, and the mixture composition was changed to $Co_4Sb_{11.275}Te_{0.6}Sn_{0.125}$.

Experimental Example 1: Measurement of Lattice Thermal Conductivity

The lattice thermal conductivity of the compound semiconductors obtained in the examples and comparative examples was measured, and the results are shown in FIGS. 1 and 2.

Specifically, the compound semiconductors obtained in the examples and comparative examples were processed into a coin-type having a diameter of 12.7 mm and a height of 1.5 mm to prepare specimens. Then, the thermal conductivity of the specimens was calculated from the measured values of thermal diffusivity, specific heat, and density by means of a laser flash (Netzsch, LFA-457) in the range of 50° C. to 500° C. Then, the Lorenz number was calculated and the value thereof was applied to the calculated thermal conductivity to obtain lattice thermal conductivity.

As a result of the experiment, as illustrated in FIG. 1, Examples 1 to 3 exhibited reduced thermal conductivities over the entire temperature measurement section in comparison to those of Comparative Examples 1 to 5 in which Sn was not substituted. These results were obtained due to the fact that the lattice thermal conductivity was reduced when Sn was substituted at Sb sites of S-filled Skutterudite. In addition, Examples 1 to 3 showed remarkably reduced lattice thermal conductivities in comparison with that of Comparative Example 6 in which S was not filled but Te and Sn were substituted at Sb sites. From these results, it can be confirmed that the reduction effect in the lattice thermal conductivity due to the filling of S is remarkable.

Further, as illustrated in FIG. 2, Examples 4 to 6 in which the substitution amounts of Sn were increased showed reduced lattice thermal conductivity through a control with the substitution amount of Te, in comparison with those of Comparative Examples 1 to 6.

Experimental Example 2: Thermoelectric Performance Index (ZT)

The thermoelectric performance index of the compound semiconductors obtained in Examples 1 to 3 and Comparative Examples 1 to 6 was measured, and the results are shown in Tables 1 and 2 and FIG. 3.

The compound semiconductors obtained in Examples 1 to 3 and Comparative Examples 1 to 6 were processed into a rectangular-type having a length of 3 mm, a width of 3 mm, and a height of 12 mm to prepare specimens. Then, the electrical conductivity and the Seebeck coefficient of the specimens were measured using ZEM-3 (Ulvac-Rico, Inc) in the range of 50° C. to 500° C.

Next, the thermoelectric performance index (ZT) was calculated from the measured electrical conductivity, Seebeck coefficient, and thermal conductivity value of Experimental Example 1 described above by using Mathematical Equation 1 below.

$$ZT = \sigma S^2 T/K \qquad \text{[Mathematical Equation 1]}$$

Herein, ZT represents a thermoelectric performance index, σ represents electrical conductivity, S represents a Seebeck coefficient, T represents temperature, and κ represents thermal conductivity.

TABLE 1

| Temperature (° C.) | Examples | | | Comparative Examples | | | | | |
|---|---|---|---|---|---|---|---|---|---|
| | 1 | 2 | 3 | 1 | 2 | 3 | 4 | 5 | 6 |
| 50 | 0.27 | 0.29 | 0.28 | 0.25 | 0.28 | 0.25 | 0.21 | 0.24 | 0.187 |
| 100 | 0.37 | 0.39 | 0.38 | 0.34 | 0.38 | 0.34 | 0.29 | 0.33 | 0.254 |
| 200 | 0.60 | 0.62 | 0.61 | 0.55 | 0.59 | 0.55 | 0.48 | 0.54 | 0.415 |
| 300 | 0.84 | 0.87 | 0.87 | 0.77 | 0.82 | 0.77 | 0.68 | 0.76 | 0.597 |
| 400 | 1.05 | 1.11 | 1.12 | 0.96 | 1.03 | 0.99 | 0.87 | 0.97 | 0.781 |
| 500 | 1.22 | 1.32 | 1.33 | 1.06 | 1.19 | 1.19 | 1.03 | 1.14 | 0.944 |

As a result, as illustrated in Tables 1 and 2 and FIG. 3, the compound semiconductors obtained in Examples 1 to 3 had lowered lattice thermal conductivity and thereby showed a high thermal performance index over the entire temperature measurement section in comparison with those of Comparative Examples 1 to 6.

Experimental Example 3: Measurement of Electrical Conductivity

The electrical conductivity of the compound semiconductors obtained in the examples and comparative examples was measured, and the results are shown in FIG. 4 below.

The electrical conductivity was measured using ZEM-3 (Ulvac-Rico, Inc) equipment.

As a result, as illustrated in FIG. 4, the compound semiconductors obtained in Examples 4 to 6 showed increased electrical conductivity at the entire temperature measurement section in comparison with that of Comparative Example 3. From this, it can be confirmed that the electrical conductivity, which could be lowered as Sn was substituted at Sb sites of S-filled skutterudite, was increased through the substitution with Te.

The invention claimed is:

1. A compound semiconductor represented by the following Chemical Formula 1:

$$S_xCo_4Sb_{12-y-z}Q_ySn_z \quad \text{[Chemical Formula 1]}$$

wherein in Chemical Formula 1,
Q comprises at least one among O, Se, and Te, and
x, y, and z are denote a molar ratio, wherein $0<x\leq1$, $0<y<12$, $0<z<12$, $0<y+z<12$, and $y\geq3x$,
wherein the compound semiconductor is one in which S is filled as a filler in an n-type Co—Sb skutterudite which is simultaneously substituted with a chalcogen element Q and Sn at Sb sites.

2. The compound semiconductor of claim 1, wherein in Chemical Formula 1, $y\geq3x$ when $0<y+z<1$.

3. The compound semiconductor of claim 1, wherein in Chemical Formula 1, $y=3x+z$ when $1\leq y+z<12$.

4. The compound semiconductor of claim 1, wherein in Chemical Formula 1, x is in the range of $0.1\leq x\leq0.2$.

5. The compound semiconductor of claim 1, wherein in Chemical Formula 1, y and z are in the range of $0.6\leq y\leq0.8$ and $0.05\leq z\leq0.2$, respectively.

6. The compound semiconductor of claim 1, wherein in Chemical Formula 1, Q is Te.

7. A method for preparing the compound semiconductor of claim 1 comprising:
mixing S, Co, Sb, Q, and Sn in a content so as to satisfy a compound composition of the following Chemical Formula 1 to provide a mixture; and
thermally treating the mixture:

$$S_xCo_4Sb_{12-y-z}Q_ySn_z \quad \text{[Chemical Formula 1]}$$

wherein in Chemical Formula 1,
Q comprises at least one among O, Se, and Te, and
x, y, and z denote a molar ratio, wherein $0<x\leq1$, $0<y<12$, $0<z<12$, $0<y+z<12$, and $y\geq3x$.

8. The method for preparing the compound semiconductor of claim 7, wherein thermally treating the mixture is performed at a temperature of 400° C. to 800° C.

9. The method for preparing the compound semiconductor of claim 7, further comprising a cooling step after thermally treating the mixture.

10. The method for preparing the compound semiconductor of claim 7, further comprising a pressure-sintering step after thermally treating the mixture.

11. A thermoelectric conversion device comprising the compound semiconductor according to claim 1.

12. A solar cell comprising the compound semiconductor according to claim 1.

* * * * *